(12) United States Patent
Hartzsch

(10) Patent No.: US 6,909,275 B2
(45) Date of Patent: Jun. 21, 2005

(54) ELECTRICAL CIRCUIT FOR DRIVING A LOAD

(75) Inventor: Joerg Hartzsch, Dortmund (DE)

(73) Assignee: ELMOS Semiconductor AG (DE)

( * ) Notice: Subject to any disclaimer, the term of this patent is extended or adjusted under 35 U.S.C. 154(b) by 0 days.

(21) Appl. No.: 10/783,746

(22) Filed: Feb. 20, 2004

(65) Prior Publication Data

US 2004/0227530 A1 Nov. 18, 2004

(30) Foreign Application Priority Data

Feb. 24, 2003 (EP) .............................. 03004023

(51) Int. Cl.[7] .......................... G01R 1/04; H01H 31/02
(52) U.S. Cl. .................................. 324/158.1; 324/537
(58) Field of Search ............................ 324/158.1, 537, 324/713, 715; 327/108, 110, 111, 482, 484

(56) References Cited

U.S. PATENT DOCUMENTS

| 3,150,315 A | | 9/1964 | Simon | |
|---|---|---|---|---|
| 3,227,953 A | | 1/1966 | Cerveny | |
| 4,287,436 A | * | 9/1981 | Tezuka et al. | 327/110 |
| 4,410,808 A | * | 10/1983 | Woodhouse | 327/110 |
| 6,400,163 B1 | * | 6/2002 | Melcher et al. | 324/713 |

FOREIGN PATENT DOCUMENTS

| DE | 943 072 | | 5/1951 | |
|---|---|---|---|---|
| DE | 3535844 A1 | * | 4/1987 | H03K/17/64 |
| EP | 0 215 190 A1 | | 3/1987 | |
| EP | 1050965 A2 | * | 11/2000 | H03K/17/082 |
| JP | 58135471 A | * | 8/1983 | G01R/31/02 |
| JP | 61065167 A | * | 4/1986 | G01P/3/489 |

* cited by examiner

*Primary Examiner*—Vinh Nguyen
*Assistant Examiner*—Jermele Hollington
(74) *Attorney, Agent, or Firm*—Shumaker & Sieffert, P.A.

(57) ABSTRACT

The electrical circuit for driving a load comprises a transistor (12;14;22) having a load current flowing therethrough, a measurement device (30,32) for determining the voltage drop across this transistor (12;14;22), a device (42) for impressing a measuring current into the transistor (12;14;22), and a device for determining the resistance value of the transistor (12;14;22) in its ON state, this resistance value being between a known maximum value ($R_{XMAX}$) and a known minimum value ($R_{XMIN}$). The device for determining the resistance value is provided with a measuring bridge (36) having the transistor (12;14;22) and a known reference resistor ($R_R$) arranged in its first bridge arm (38) and having three respectively known resistors ($R_1, R_2, R_3$) arranged in its second bridge arm (40).

9 Claims, 4 Drawing Sheets

$$\frac{R_{XMAX}}{R_R + R_{XMAX}} = \frac{R_1 + R_2}{R_1 + R_2 + R_3}$$

$$\frac{R_{XMIN}}{R_R + R_{XMIN}} = \frac{R_1}{R_1 + R_2 + R_3}$$

US 6,909,275 B2

ELECTRICAL CIRCUIT FOR DRIVING A LOAD

BACKGROUND OF THE INVENTION

The invention relates to an electrical circuit for driving a load.

In as far as electric or electromechanical systems require a measurement of current, such measurement is usually performed in that the current to be measured is guided via a shunt resistor. The resultant voltage drop can be detected by measurement technology and, provided that the resistance value is known, be converted into a current value. Thus, what is required is an accurate knowledge of the resistance value of the shunt resistor. However, shunt resistors are cost-intensive and are subjected to relative large manufacturing tolerances. Further, it is often necessary to solve problems in the assembly process. Finally, the resistance value of a shunt resistor is dependant on the temperature.

For current measurement in an electric or electromechanical system, it is thus of advantage if one can make use of the voltage drop across a component existing in the system. In this regard, however, it is to be considered that the resistance value of such a component may lie within a per se known range of resistance values. Under this aspect, it is thus required to determine the resistance value of the component prior to the start of the intended use of the electric or electromechanical system, wherein the only known parameter is to be seen in that the possible minimum value and the possible maximum value of the resistance of the respective electrical component are known.

Thus, it is an object of the invention to provide an electrical circuit comprising a device for determining the resistance value of a transistor of this circuit which only the maximum possible resistance value and the minimum possible resistance value are known.

BRIEF SUMMARY OF THE INVENTION

According to the invention, the above object is achieved by an electrical circuit comprising a transistor whose resistance value lies between a known maximum value and a known minimum value, which is detected by means of a measuring bridge.

The above is a device for determining the resistance value $R_X$ of a transistor whose resistance value RX lies between a known maximum value $R_{XMAX}$ and a known minimum value $R_{XMIN}$, by means of a measuring bridge having the transistor and a known reference resistor $R_R$ arranged in its first bridge arm and having three respectively known resistors $R_1, R_2, R_3$ arranged in its second bridge arm, the first bridge arm comprising a resistor connecting point is $K_1$ between the reference resistor $R_R$ and the transistor, and the second bridge leg comprising a first resistor connecting point $K_2$ between the first resistor $R_1$ connected to the transistor, and the second resistor $R_2$, as well as a second resistor connecting point $K_3$ between the second resistor $R_2$ and the third resistor $R_3$ connected to the reference resistor, and the values of the reference resistor $R_R$ of first bridge arm and of the three resistors $R_1, R_2, R_3$ of the second bridge arm being selected in such a manner that (i) the potential of the resistor connecting point $K_1$ of the first bridge leg is equal to the potential of the first resistor connecting point $K_2$ of the second bridge leg if the transistor is at its minimum resistance value $R_{XMIN}$, and (ii) the potential of the resistor connecting point $K_1$ of the first bridge leg is equal to the potential of the second resistor connecting point $K_3$ of the second bridge leg if the transistor is at its maximum resistance value $R_{XMAX}$, both bridge legs of the measuring bridge have a measuring current $I_T$ flowing therethrough, and on the basis of the ratios of the difference voltages between the resistor connecting point $K_1, K_2, K_3$, on the basis of the minimum resistance value $R_{XMIN}$ and on the basis of the maximum resistance value $R_{XMAX}$, the present resistance value $R_X$ of the transistor is detected.

Advantageous embodiments of the inventive circuit are indicated in the respective subclaims 2 to 9.

In the inventive determination of the resistance value of a transistor, use is made of a measuring bridge having an arrangement similar to that of a Wheatstone measuring bridge (see e.g. U.S. Pat. No. 3,150,315, U.S. Pat. No. 3,227,953, EP-A-0 215 190 and DE-C-943 072), with the exception, however, that none of the resistances can be changed. In the first of the two bridge legs of this measurement bridge, the transistor whose resistance is to be determined has a known reference resistance arranged next to it. In the second bridge leg of the measuring bridge, a serial circuit comprising three known resistances is arranged. The values of the known resistors of the measuring bridge are determined in the manner described above. The inventive measuring bridge is represented in FIG. 1. Of the resistance $R_X$ to be determined, it is only known that it lies between $R_{XMIN}$ and $R_{XMAX}$. After the reference resistance $R_R$ of the first bridge leg and one of the three resistances of the second bridge leg, in the instant case the resistance $R_3$, have been predetermined, the values for the resistances $R_1$ and $R_2$ can be obtained from the following two equations:

$$R_{XMAX}/(R_R+R_{XMAX})=(R_1+R_2)/(R_1+R_2+R_3)$$

$$R_{XMIN}/(R_R+R_{XMIN})=R_1/(R_1+R_2+R_3)$$

A measuring bridge dimensioned in the above manner can now be used, when impressing a test current $I_T$, to determine the resistance value of $R_X$, i.e. the resistance value of a transistor. For this purpose, the difference voltages between the nodes of $K_1$ and $K_2$, $K_1$ and $K_3$ or $K_2$ and $K_3$ are obtained through measurement technology. Two of these difference voltages have to be detected to thus be able to obtain the resistance value of $R_X$ therefrom (e.g. according to the rule of three).

If, for instance, the voltage difference between the nodes $K_1$ and $K_2$ is 0 Volts, the value of the resistance $R_X$ is equal to its minimum value. If, on the other hand, the difference voltage between the nodes $K_1$ and $K_3$ is 0 Volts, the value of the resistance $R_X$ is equal to the maximum value. In case of difference voltage values between the nodes $K_1$ and $K_2$ and $K_1$ and $K_3$, respectively, which are unequal to 0 Volts, value of the resistance $R_X$ is equal to the respective percentage of the maximum or minimum value.

Thus, in the above described manner, the value of the resistance $R_X$, i.e. the resistance value of a transistor, can be determined through measurement technology, when all that is known of a transistor is that its resistance value is between a known maximum value and a known minimum value.

Therefore, the invention makes it possible, in order to perform a current measurement within an electric or electronic and resp. electromechanical system, to use, for a shunt resistor, a transistor of this system of which only the allowable range of resistance values is known. The transistor which can thus be used may be, for instance, a polarity protection transistor or also a transistor switching a load (highside or lowside switch) of which the minimum and the maximum value of the ON-resistance is known. However, also any other transistor having an ohmic portion, i.e. also a resistor, can be used as a to-be-measured transistor.

In the normal case, the transistor which according to the invention can be used as a replacement for a shunt resistor, such as e.g. a polarity protection transistor or a load-switching transistor, is temperature-independent with regard to its ON resistance. Thus, the above described inventive calibration is suitably performed when the temperature of the transistor used as a shunt transistor undergoes a change. The detection of the temperature can then be performed through measuring technology by means of a temperature sensor. By way of alternative, however, it is also possible to draw conclusions on the thermal stress and thus the heating of the transistor on the basis of the electric stresses, particularly on the basis of the current flowing through the transistor. A further possibility for the determination of the resistance of the temperature-dependent transistor resides in performing the calibrating method cyclically after the lapse of respectively a time span, i.e. in determining the to-be-determined resistance value on an up-to-date basis each time.

BRIEF DESCRIPTION OF THE DRAWING

The invention will be explained in greater detail hereunder with reference to the drawing. The individual Figures show the following.

DETAILED DESCRIPTION OF THE INVENTION

Figure 2:
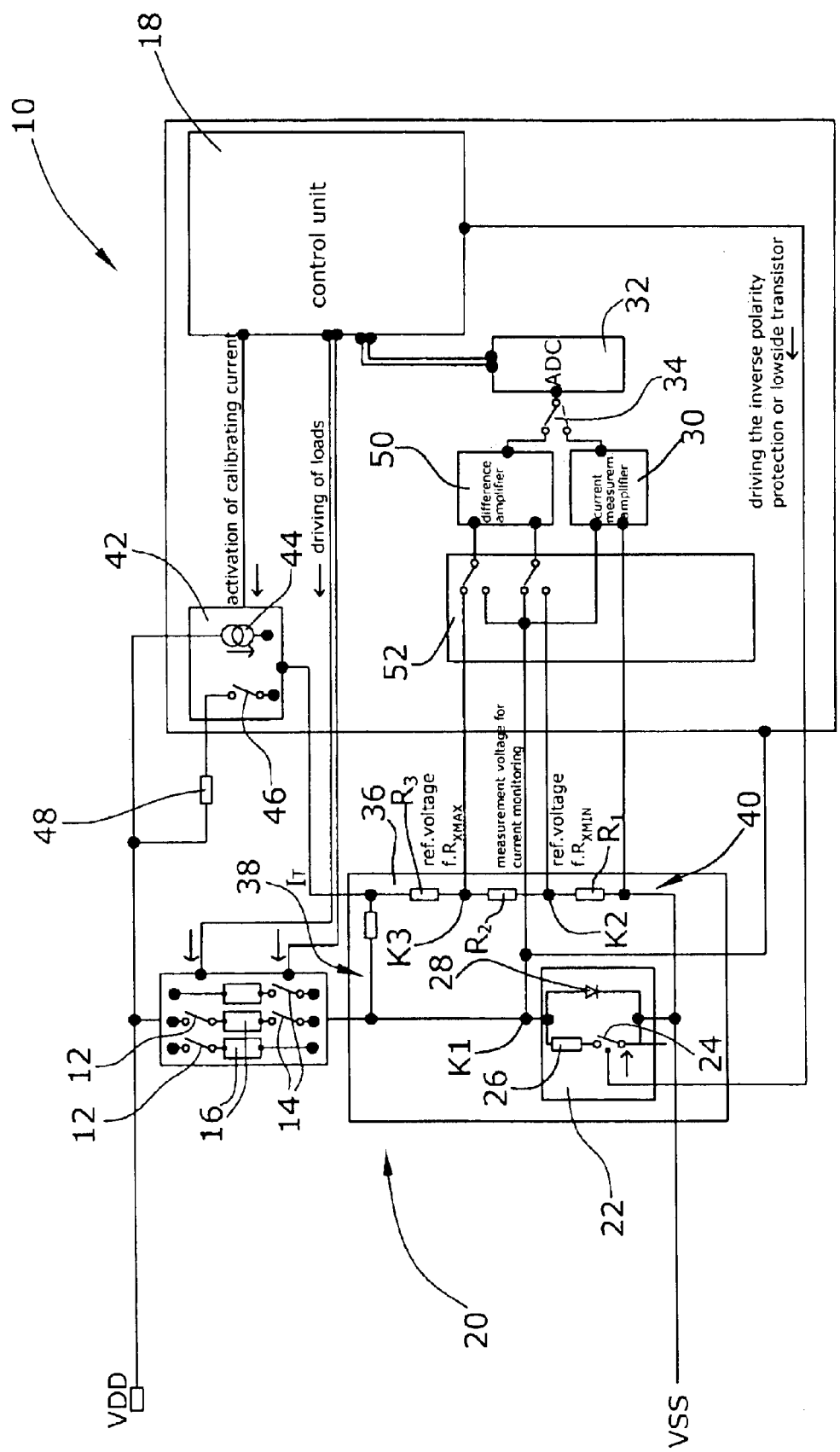
FIGS. 2 to 4 different variants of an inventive circuit for measuring the ohmic resistances of transistors of the circuit and resp. of a resistor of the circuit, which during the application serve for current measurement.

Illustrated in FIG. 2 is a first embodiment of an electric or electromechanical system 10 in which, for current measurement during operation, use is made of a transistor of system 10, in this case a polarity protection transistor, which before has been measured as provided according to the invention. System 10 comprises an electrical circuit which, in this embodiment, is used to drive highside and lowside switches 12,14 which in turn drive a load 16. The highside and lowside switches 12,14 are driven via a control unit 18. In the energy supply path of the load current circuit 20, there is arranged a polarity protection transistor 22 of which FIG. 2 shows a substitute circuit diagram comprising a switch 24, an ON resistance 26 and a diode 28 connected in parallel to both. Also the polarity protection transistor 22 is controlled via control unit 18.

According to the invention, this polarity protection transistor 22 or, put more precisely, its ON resistance 26 (hereunder also referred to as $R_X$) are used for current measurement. For this purpose, the voltage drop across the ON resistance $R_X$ is picked up by a current measurement amplifier 30 and is supplied to control unit 18 by means of an A/D converter 32 connected to the output of amplifier 30. Then, provided that the value of the ON resistance $R_X$ is known, the voltage can be calculated on the basis of the measured voltage drop. Thus, during the application, switch 34 between current measurement amplifier 30 and A/D converter 32 will connect the two units (see the interrupted line in FIG. 2).

Also the switching state of switch 34 is controlled via the control unit which, however, is not illustrated in FIG. 2. To be now able to measure the ON resistance $R_X$ whose minimum value and whose maximum value are known while its exact value is unknown, the above described circuit of system 10 is supplemented by the parts and circuit components mentioned hereunder. First to be mentioned in this regard is the inclusion of the polarity protection transistor 22 into a modified resistance measuring bridge 36. Further, a reference resistor $R_R$ is connected in series with the ON resistance $R_X$. Connected in parallel to this series circuit comprising reference resistor $R_R$ and polarity protection transistor 22 is a further resistor series circuit comprising the three resistors $R_1, R_2$ and $R_3$. Thus, the first bridge leg 38 of measuring bridge 36 comprises the reference resistor $R_R$ and the polarity protection transistor 22 while the second bridge leg 40 comprises the three resistors $R_1, R_2$ and $R_3$. Between the individual resistors, there are then provided the nodes or resistor connecting points $K_1$, $K_2$ and $K_3$.

For impressing a measurement or calibration current into measuring bridge 36, use is made of the unit 42 which is either provided as a current source 44 or comprises a switch 46 which, when closed, will cause a current to be impressed into measuring bridge 36 via a resistor 48. The activation of the calibrating current is performed by control unit 18.

Beyond the above, the measuring of the ON resistance $R_X$ requires a difference amplifier 50 which via a multiplexer 52 connected upstream thereof selectively detects the difference voltages between the resistor connecting nodes $K_1$ and $K_2$, $K_1$ and $K_3$, and $K_2$ and $K_3$, respectively. The output signal of difference amplifier 50 is supplied to control unit 18 via the A/D converter 32. For this purpose, switch 34 assumes the switched position represented in continuous lines in FIG. 2.

Figure 3:
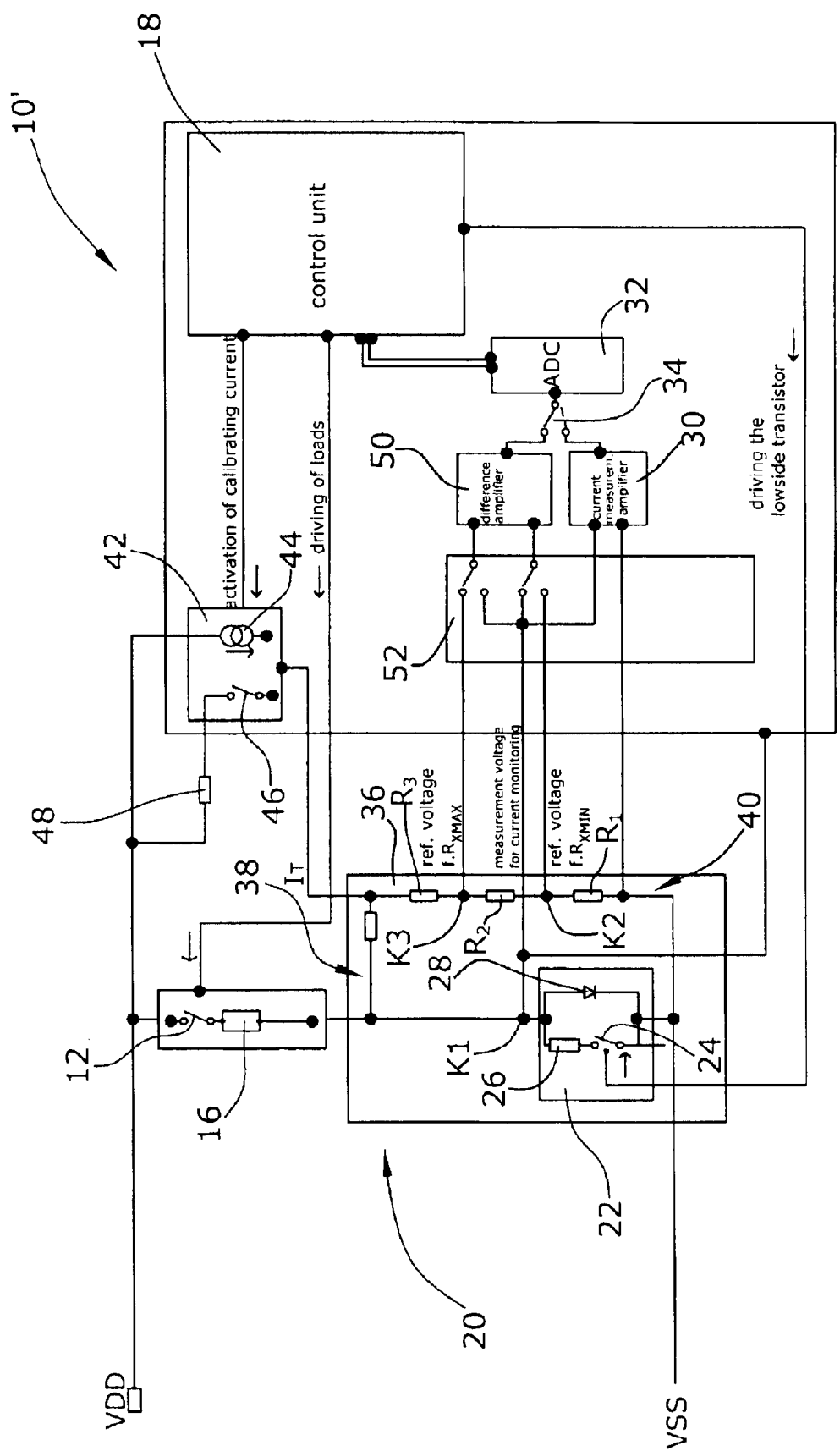
Figure 4:
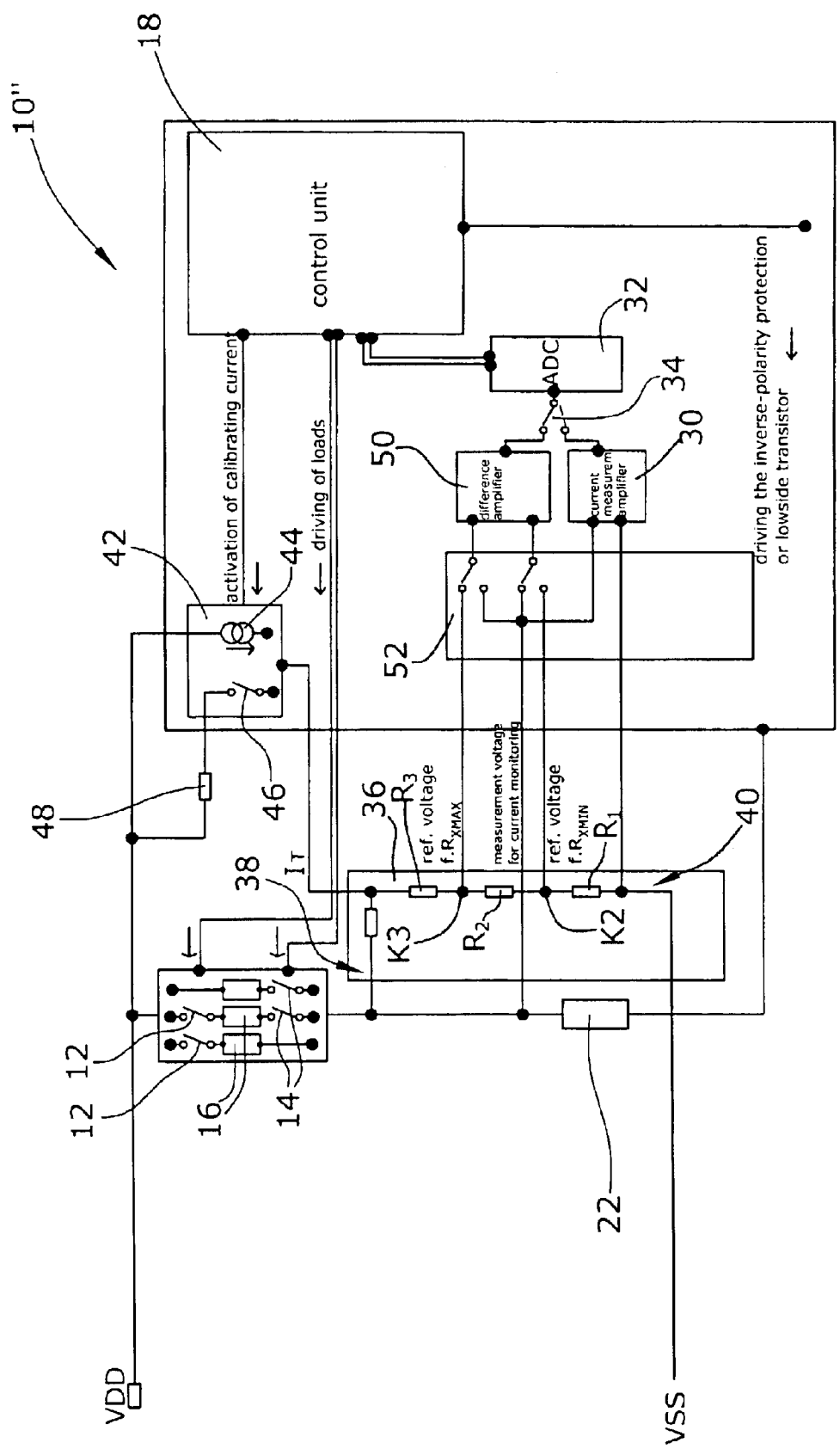

FIGS. 3 and 4 illustrate two alternative concepts belonging to the system 10 according to FIG. 2, wherein, according to FIG. 3, a lowside switch is used for current measurement and in FIG. 4 an ohmic resistor is used as a shunt resistor. The basic arrangement of these two alternative systems 10' and 10" is however the same as described in connection with FIG. 2.

Figure 1:
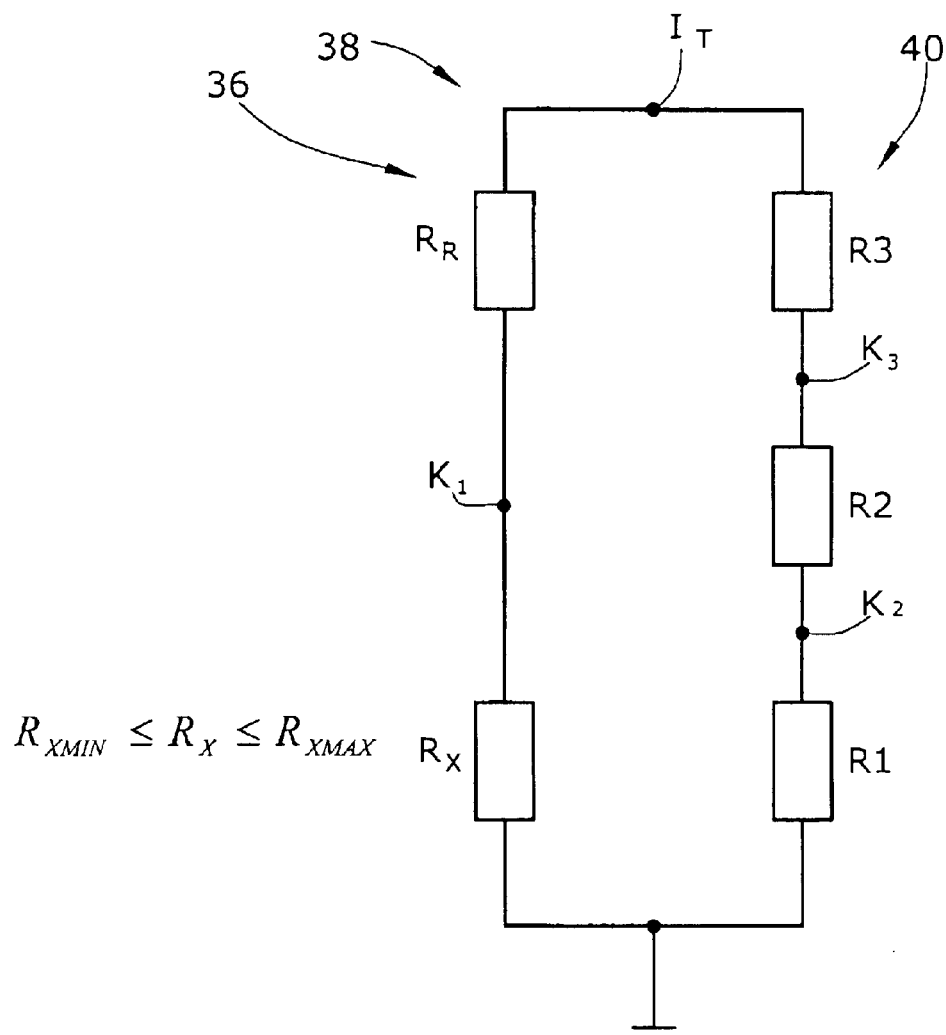
FIG. 1 the resistance measuring bridge provided according to the invention.

For all of the variants, with regard to the dimensioning of the still-to-be-determined resistors $R_1$, $R_2$, $R_3$ and $R_R$ of resistance measuring bridge 36 and with reference to what has been mentioned in connection with FIG. 1, the following applies.

The only values of resistance measuring bridge 36 are the maximum and minimum values $R_{XMAX}$ and $R_{XMIN}$ of resistor $R_X$.

First, now, the resistance value for resistor $R_X$ and the calibrating current are determined. Both parameters are to be selected in such a manner that the voltage which during calibration occurs on the resistor connecting node $K_3$ will be at the upper edge of the voltage range that the difference amplifier 50 is able to process.

Thereafter, the sum of the resistances $(R_1+R_2+R_3)$ is determined. This sum may indeed have a rather high ohmic value while it is important that input currents of current measurement amplifier 30 remain negligible.

The computation of the values for the resistors $R_1$ and $R_2$ will then be performed by resolution of the above mentioned equations, wherein the following applies:

$$R_2 = R_{XMAX} \times (R_1+R_2+R_3)/(R_R+R_{XMAX})-R_1$$

$$R_3 = (R_1+R_2+R_3)-R_1-R_2$$

Now, after the dimensioning of the resistors of measuring bridge 36 has been carried out in the above described manner, the measurement of resistor $R_X$ will be performed.

For this purpose, a calibrating current $I_T$ is impressed into the resistance measuring bridge 36. This is performed, as one alternative, by closing the switch 46 so that a defined calibrating current will flow through reference resistor $R_R$ and polarity protection transistor 22 (FIG. 2). Alternatively, the calibrating current can also be generated by means of a current source 44 of unit 42. A negligibly small portion of the calibrating current is guided via the second bridge leg 40 of measuring bridge 36. This second bridge leg 40 generates the minimum and maximum references of the resistor $R_X$ which is to be measured, as has been explained above.

Through the difference amplifier 50 with switchable input multiplexer 52, the following four measurements can be performed now:

$\Delta U(K_1-K_2)$   a)

$\Delta U(K_3-K_1)$   b)

$\Delta U(K_3-K_2)$   c)

$\Delta U(K_1-K_1)$ for offset adjustment   d)

Variants d.1) Offsets can be detected directly by use of the measurement technology, provided that the difference amplifier 50 and the A/D converter 32 can process negative as well as positive voltage differences.

d.2) The difference amplifier 50 is designed to have a typically positive offset (Thus, the offset is always measurable, even in case of an A/D converter 32 operating only in a unipolar manner).

Suitably, in order to minimize errors caused by nonlinearities of difference amplifier 50 and A/D converter 32 (particularly in the range of small input voltages), the following methods should be applied:

1. All four possible measurements 3a) to 3d) are performed.
2. The offset $\Delta U(K_1-K_1)$ is subtracted from all four measurement values.
3. It is detected which one of the two measurement values a) or b) is the larger one.
4. On the basis of this larger value it is calculated, using the rule of three, at which percentage between the lower reference ($K_2$) and the upper reference ($K_3$) the voltage has been measured at $K_1$.

If $\Delta U(K_3-K_1)>\Delta U(K_1-K_2)$ #$\Delta U$ %=100×$\Delta U(K_3-K_2)-\Delta U(K_3-K_1)$/$\Delta U(K_3-K_2)$   4.a)

If $\Delta U(K_3-K_1)<\Delta U(K_1-K_2)$ #$\Delta U$ %=100×$\Delta U(K_1-K_2)/\Delta U(K_3-K_2)$ 4.b)

The absolute voltages in relation to the VSS potential are unimportant in this regard. Thus, neither an exact calibrating current nor an exact amplification factor are required. Both parameters need only be constant across the three measurements.

5. From the percentage indication $\Delta U$ %, it is now possible, again by use of the rule of three, to calculate the resistance $R_X$ which is to be determined. In the voltage divider, the ratio of the resistance values corresponds to the ratio of the voltages which drop at the resistors. Thus, there applies the following:

$R_X = R_{XMIN} + \Delta U\ \% \times (R_{XMAX} - R_{XMIN})/100$

The values $R_{XMAX}$ and $R_{XMIN}$ are known to the system. They form the upper and lower ends of the measurable range of resistance and are fixedly set by the developer.

The control unit 18 will now know the resistance value $R_X$ of the structure used as a shunt device.

Now, when during the presently ongoing application a current is flowing through this shunt $R_X$, the voltage drop is transmitted via the current measurement amplifier 30 to A/D converter 32 and control unit 18. The latter will now be able to calculate the current required by the application on the basis of the voltage drop and the known resistance value $R_X$.

What is claimed is:

1. An electrical circuit for driving a load, comprising a transistor having a load current flowing therethrough, a measurement device for determining the voltage drop across the transistor, a device for impressing a measuring current into the transistor, and a device for determining the resistance value of the transistor in its ON state, this resistance value being between a known maximum value ($R_{XMAX}$) and a known minimum value ($R_{XMIN}$), wherein the device for determining the resistance value is provided with a measuring bridge having the transistor and a known reference resistor arranged in its first bridge arm and having three respectively known resistors arranged in its second bridge arm, the first bridge arm comprising a resistor connecting point between the reference resistor and the transistor, and the second bridge leg comprising a first resistor connecting point ($K_2$) between the first resistor connected to the transistor, and the second resistor, as well as a second resistor connecting point between the second resistor and the third resistor connected to the reference resistor, and the values of the reference resistor of the first bridge arm and of the three resistors of the second bridge arm being selected in such a manner that (i) the potential of the resistor connecting point of the first bridge leg is equal to the potential of the first resistor connecting point of the second bridge leg if the transistor is at its minimum resistance value, and (ii) the potential of the resistor connecting point of the first bridge leg is equal to the potential of the second resistor connecting point of the second bridge leg if the transistor is at its maximum resistance value.

2. The electrical circuit according to claim 1, characterized in that the transistor is a polarity protection transistor or a transistor switching the load.

3. The electrical circuit according to claim 1 or 2, characterized by a device for measuring the difference voltages between the resistor connecting points.

4. The electrical circuit according to any one of claims 1 to 3, characterized by a multiplexer for selectively passing on one of the measurement voltages to a voltage measuring device.

5. The electrical circuit according to claim 1 or 2, characterized by a device for measuring individual voltages between respectively the resistor connecting points and a common reference potential, and for subtraction of respectively two measured individual voltages.

6. The electrical circuit according to any one of claim 1 to 5, characterized by an A/D converter for measurement of the voltages.

7. The electrical circuit according to claim 6, characterized by a switch at the input of the A/D converter, for using the A/D converter on the one hand for voltage measurements and on the other hand for measurements of the voltage drop across the transistor of which the resistance value has to be determined for thus obtaining the load current.

8. The electrical circuit according to any one of claims 1 to 7, characterized by a control unit provided to control the device for impressing a measuring current into the transistor and, if provided, of the switch, of the A/D converter, of the multiplexer, of a polarity protection transistor and of a load-switching transistor.

9. The electrical circuit according to any one of claims 1 to 8, characterized by a temperature sensor for detecting the ambient temperature of the transistor of which the resistance value has to be determined.

* * * * *